United States Patent
Ikeda et al.

(10) Patent No.: US 6,744,307 B2
(45) Date of Patent: Jun. 1, 2004

(54) FILTER CIRCUIT

(75) Inventors: Takeshi Ikeda, Tokyo (JP); Hiroshi Miyagi, Yokohama (JP)

(73) Assignee: Niigata Seimitsu Co., Ltd. (JP)

( * ) Notice: Subject to any disclaimer, the term of this patent is extended or adjusted under 35 U.S.C. 154(b) by 0 days.

(21) Appl. No.: 10/406,186

(22) Filed: Apr. 4, 2003

(65) Prior Publication Data

US 2003/0169100 A1 Sep. 11, 2003

Related U.S. Application Data

(63) Continuation of application No. PCT/JP01/08335, filed on Sep. 26, 2001.

(30) Foreign Application Priority Data

Oct. 6, 2000 (JP) ......................... 2000-308256

(51) Int. Cl.[7] .............................................. H03K 5/00
(52) U.S. Cl. ..................................... 327/559; 327/552
(58) Field of Search ................................ 327/552, 559, 327/558

(56) References Cited

U.S. PATENT DOCUMENTS

| | | | |
|---|---|---|---|
| 5,027,017 A | | 6/1991 | Fling ........................ 327/321 |
| 5,760,642 A | * | 6/1998 | Yada ......................... 327/558 |
| 5,864,256 A | * | 1/1999 | Dick et al. .................. 327/552 |
| 5,982,227 A | * | 11/1999 | Kim et al. ................... 327/543 |
| 6,091,289 A | * | 7/2000 | Song et al. ................... 327/558 |
| 6,111,468 A | * | 8/2000 | Tanishima .................... 331/17 |
| 6,437,639 B1 | * | 8/2002 | Nguyen et al. ............. 327/558 |

FOREIGN PATENT DOCUMENTS

| JP | 04212570 A | 8/1992 |
|---|---|---|
| JP | 2001238287 A | 8/2001 |

OTHER PUBLICATIONS

International Search Report, PCT/JP01/08335, Dec. 25, 2001, pp 1.

* cited by examiner

*Primary Examiner*—Dinh T. Le
(74) *Attorney, Agent, or Firm*—Connolly, Bove, Lodge & Hutz LLP; Larry J. Hume

(57) ABSTRACT

A filter includes a capacitor (1) connected between the input end IN and the output end OUT of signals and constant current circuits (2, 3) of MOS structure connected between the power source VDD and the ground, and by connecting the output side node of the capacitor (1) and the intermediate node of the constant current circuits (2, 3). Thus, the cut-off frequency of the filter is reduced dy adjusting the value of a current passed through the constant current circuits (2, 3), instead of increasing the circuit area required by using a capacitor having a large capacitance value or a resistor having a large resistance value.

14 Claims, 4 Drawing Sheets

FIG. 1 (CONVENTIONAL)
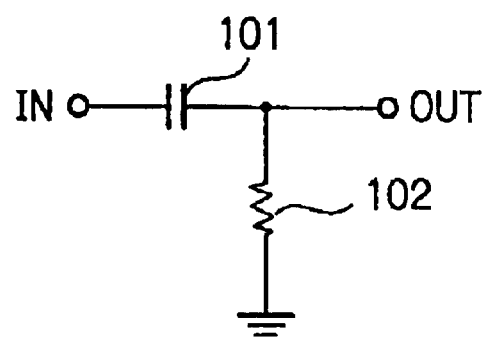

FIG. 6 (CONVENTIONAL)
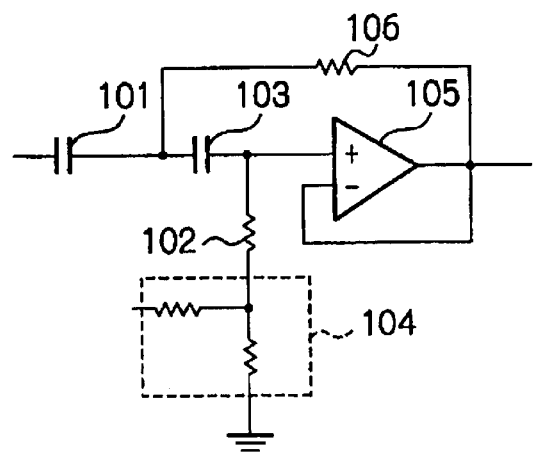

FILTER CIRCUIT

CROSS-REFERENCE TO RELATED APPLICATIONS

This application is a continuing application of co-pending International Application PCT/JP01/08335, filed on Sep. 26, 2001, and published as International Publication WO 02/31976 A1 on Apr. 18, 2002, by Takeshi IKEDA and Hiroshi MIYAGI for "FILTER CIRCUIT", the entire contents of which are hereby incorporated by reference, and for which benefit is claimed under 35 U.S.C. § 120, and which, in turn, claims the right of priority under 35 U.S.C. § 119 to Japanese Application No. 2000-308256 by the above-named applicants, filed on Oct. 6, 2000.

BACKGROUND OF THE INVENTION

The present invention relates to a filter circuit. More particularly, the present invention is suitably applied to a high-pass filter circuit that allows only a signal of a high band frequency to pass therethrough, formed in an IC chip.

Well-known filters are categorized into low-pass filters (LPF), high-pass filters (HPF), etc., according to frequency selection performance. A low-pass filter is a filter which allows signals of frequencies below a selected frequency to pass therethrough while blocking signals of frequencies higher than the selected frequency. On the other hand, a high-pass filter is a filter which allows signals of frequencies higher than a selected frequency to pass therethrough while blocking signals of frequencies lower than the selected frequency.

FIG. 1 shows the configuration of a conventional high-pass filter based on the simplest CR circuit. As shown in FIG. 1, the conventional high-pass filter is constituted by a capacitor 101 connected between a signal input end IN and a signal output end OUT, and a resistor 102 connected to the output terminal of the capacitor 101 in parallel with the output end OUT.

The cutoff frequency $f_c$ of the thus-arranged high-pass filter, which is the point of division between the pass band and the attenuation band, is obtained from the capacitance value C of the capacitor 101 and the resistance value R of the resistor 102 as shown by the following equation (1):

$$f_c = 1/(2\pi CR) \quad (1)$$

In the case of reducing the cutoff frequency $f_c$ of the above-described conventional high-pass filter (increasing the pass band), it is necessary to increase the capacitance value C or the resistance value R. A capacitor having a large capacitance value C or a resistor having a large resistance value R (a resistance of several hundred kilohms or higher in particular), however, requires a considerably large area when incorporated in an integrated circuit (IC). Thus, with ICs incorporating a high-pass filter, there has been a program that the entire circuit area of the IC is increased.

That is, the upper limit of the capacitance value C of the capacitor 101 realizable in an integrated circuit is about several hundred picofarads and the upper limit of the resistance value R of the resistor 102 is about several hundred kilohms. It is difficult to incorporate the capacitor 101 or the resistor 102 in an integrated circuit if this value is exceeded. For this reason, the capacitor 101 having a larger capacitance value C or the resistor 102 having a larger resistance value R constituting a high-pass filter of a lower cutoff frequency $f_c$ has been realized as an external circuit for the IC.

Ordinarily, manufacturing variation of a resistor is considerably large and a variation of about ±30% to ±100% exists in a desired resistance value R. There has been a problem that a variation is also caused in cutoff frequency $f_c$ of a high-pass filter formed by using such a resistor and the stability of the transfer frequency characteristics of the filter is thereby reduced. There has also been a problem that the stability of a temperature characteristic of the high-pass filter is also reduced by such a manufacturing variation of the resistance value R.

The present invention has been achieved to solve such problems and an object of the present invention is to provide a high-pass filter having a small circuit area even in the case of reducing the cutoff frequency, having smaller manufacturing variation, and suitable for incorporation in an IC.

SUMMARY OF THE INVENTION

A filter circuit of the present invention is characterized by comprising a capacitor connected between a signal input end and a signal output end, a first constant current circuit of a MOS structure connected between the signal output end and a power source, and a second constant current circuit of a MOS structure connected between the first constant current circuit and the ground, and characterized in that the first constant current circuit has first and second pMOS transistors connected in a current mirror structure to the power source, the drain of the first pMOS transistor being connected to the signal output end.

In still another mode of implementation of the present invention, the second constant current circuit comprises a first nMOS transistor having its drain connected to the drain of the second pMOS transistor, and its gate connected to the drain of a second nMOS transistor, a first resistor connected between the source of the first nMOS transistor and the ground, the second nMOS transistor having its source and drain respectively connected to the ground and a second resistor, and the second resistor connected between the drain of the second nMOS transistor and the ground.

In still another mode of implementation of the present invention, a third nMOS transistor is provided which has its gate connected to the output node of the capacitor, and its source and drain respectively connected to the ground and the signal output end.

The present invention comprises the above-described technical means and is therefore capable of forming a high-pass filter by using a constant current circuit of a MOS structure, and capable of reducing the cutoff frequency of the filter by increasing the equivalent resistance value of the constant current circuit constituted by a MOS circuit without using a capacitor of a large capacitance value or a resistor of a large resistance value. The equivalent resistance value of the constant current circuit is increased by adjusting the value of a current caused to flow through the constant current circuit.

Thus, it is possible to provide a filter circuit having a low cutoff frequency and suitable for incorporation in an IC without increasing the circuit area. The equivalent resistance value of the constant current circuit can be changed, for example, by adjusting the gate areas of the MOS transistors constituting the MOS circuit. Since the value of the cutoff frequency is determined according to the gate areas of the MOS transistors, etc., manufacturing variation can be limited to a small value and the filter can be stabilized in temperature characteristic.

BRIEF DESCRIPTION OF THE DRAWINGS

FIG. 1 is a diagram showing the configuration of a conventional high-pass filter based on the simplest CR circuit;

FIG. 6 is a diagram showing the configuration of a conventional secondary high-pass filter.

DESCRIPTION OF PREFERRED EMBODIMENTS

An embodiment of the present invention will be described with reference to the drawings.

Figure 2:
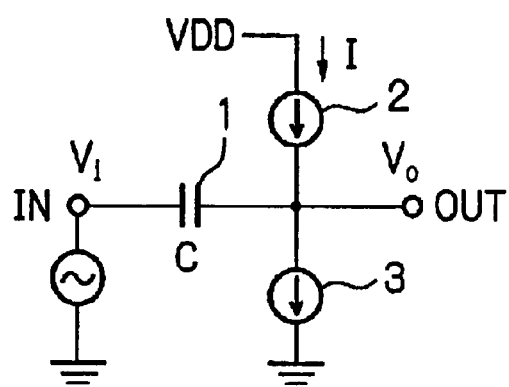
FIG. 2 is a diagram showing the principle and configuration of a high-pass filter according to an embodiment of the present invention.

FIG. 2 is a diagram showing the principle and configuration of a high-pass filter according to this embodiment. As shown in FIG. 2, the high-pass filter of this embodiment has a capacitor 1 connected between a signal input end IN and a signal output end OUT, and constant current circuits 2 and 3 in two stages connected in series between a power source VDD and the ground and is formed by connecting an output side node of the capacitor 1 and an intermediate node between the constant current circuits 2 and 3.

In the filter circuit of this embodiment shown in FIG. 2, if a filter input voltage is $V_i$; a filter output voltage is $V_o$; a current flowing through the constant current circuits 2 and 3 from the power source VDD is I; the capacitance value of the capacitor 1 is C; and the equivalent resistance value of the constant current circuits 2 and 3 is R', the ratio of the filter output voltage $V_o$ output to the output end OUT and the filter input voltage $V_i$ is $$Vo/Vi = 1/(1 + 1/j\omega CR') = j\omega CR'/(1 + j\omega CR') \qquad (2)$$

and the time constant of the high-pass filter is CR'.

Therefore the cutoff frequency $f_c$ of the high-pass filter of this embodiment is obtained from the capacitance value C of the capacitor 1 and the equivalent resistance value R' of the constant current circuits 2 and 3 as shown by the following equation (3):

$$f_c = 1/(2\pi CR') \qquad (3)$$

The equivalent resistance value R' of the constant current circuits 2 and 3 is a variable value varying according to the magnitude of the current I flowing through the constant current circuits 2 and 3.

As can be understood from this equation (3), the cutoff frequency $f_c$ of the high-pass filter can be arbitrarily set by changing the capacitance value C of capacitor 1 or the magnitude of the current I caused to flow through constant current circuits 2 and 3. The cutoff frequency $f_c$ of the high-pass filter can be reduced by increasing the equivalent resistance value R' of the constant current circuits 2 and 3. In this case, the equivalent resistance value R' of the constant current circuits 2 and 3 can be increased by forming the constant current circuits 2 and 3 of a MOS circuit without increasing the circuit area.

Figure 3:
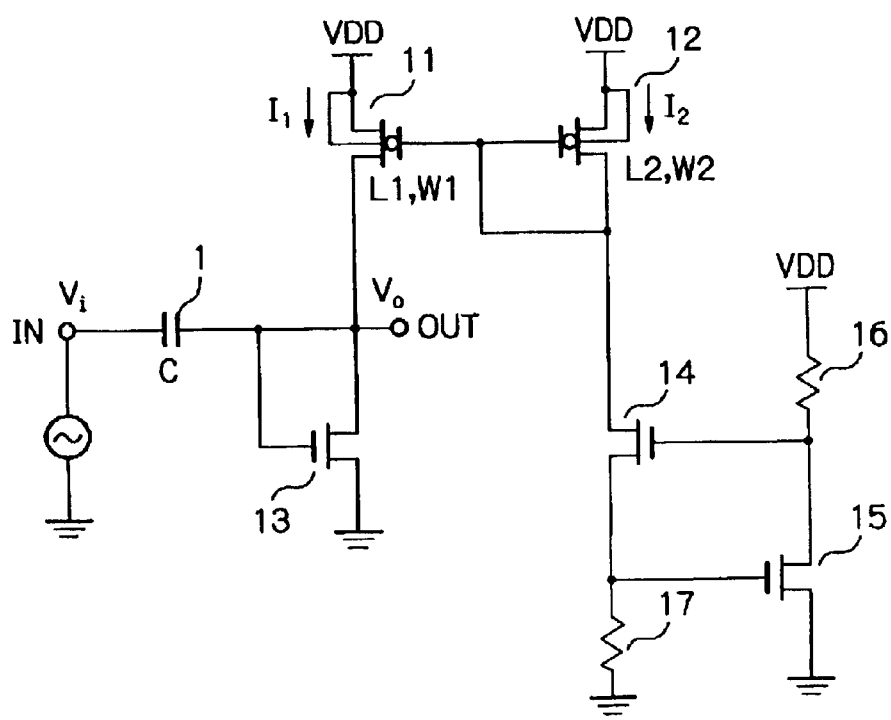
FIG. 3 is a diagram showing an example of a MOS circuit for actually realizing the high-pass filter shown in FIG. 2.

FIG. 3 is a diagram showing an example of a MOS circuit for actually realizing the above-described high-pass filter shown in FIG. 2. Components indicated in FIG. 3 by the same reference characters as those in FIG. 2 have the same functions.

As shown in FIG. 3, the capacitor 1 is connected between the signal input end IN and the signal output end OUT in the high-pass filter of this embodiment. The output node of this capacitor 1 is connected to the output end OUT and also to the gate of an nMOS transistor 13. The source of this nMOS transistor 13 is grounded, and the drain of this nMOS transistor 13 is connected to the output end OUT.

Two pMOS transistors 11 and 12 are connected in a current mirror structure to the power source VDD to form the constant current circuit 2 shown in FIG. 2. That is, the sources of the pMOS transistors 11 and 12 are connected to the power source VDD, the gates of the pMOS transistors 11 and 12 are connected to each other, and the common gate and the drain of the pMOS transistor 12 are connected, thus forming a current mirror. Each of the pMOS transistors 11 and 12 has its back gate connected to its source.

The drain of the pMOS transistor 11 in the pair of pMOS transistors forming the above-described current mirror is connected to the output end OUT and to the drain of the nMOS transistor 13. The drain of the other pMOS transistor 12 is connected to the drain of an nMOS transistor 14. This nMOS transistor 14, an nMOS transistor 15 and resistors 16 and 17 form the constant current circuit 3.

That is, the source of the nMOS transistor 14 is grounded via the resistor 17 and is connected to the gate of the nMOS transistor 15. The source of the nMOS transistor 15 is grounded and the drain of the nMOS transistor 15 is connected to the power source VDD via the resistor 16 and to the gate of the nMOS transistor 14. Each of the resistors 16 and 17 constituting the constant current circuit 3 has a small resistance value of about 10 kilohms.

In the thus-formed high-pass filter, let the current flowing through the pMOS transistor 11 in the pair of pMOS transistors forming the current mirror be $I_1$, the current flowing through the other pMOS transistor 12 be $I_2$, the gate length and the gate width of the pMOS transistor 11 be $L_1$ and $W_1$, respectively, and the gate length and the gate width of the other pMOS transistor 12 be $L_2$ and $W_2$, respectively. The cutoff frequency $f_c$ in this case is determined from the capacitance value C of the capacitor 1 and the current $I_1$ caused to flow through one pMOS transistor 11 because of the pMOS transistors 11 and 12 in the current-mirror relationship.

Then, if the gate lengths $L_1$ and $L_2$ of the pMOS transistors 11 and 12 are made equal to each other ($L_1 = L_2$), the current I1 flowing through one pMOS transistor 11 is obtained as shown by the following equation (4):

$$I_1 = (W_1/W_2)I_2 \qquad (4)$$

That is, the magnitude of the current $I_1$ flowing through one pMOS transistor 11 is determined by the ratio of the gate widths $W_1$ and $W_2$ of the pMOS transistors 11 and 12.

It is, therefore, possible to reduce the cutoff frequency $f_c$ of the high-pass filter in such a manner that the current $I_1$ is reduced by adjusting the gate widths $W_1$ and $W_2$ of the pMOS transistors 11 and 12 to increase the equivalent resistance value R' of the constant current circuits 2 and 3. Since in this case the constant current circuits 2 and 3 realizing a large equivalent resistance value R' are constituted by a MOS circuit, the circuit area is not increased relative to that in a case where a resistor having a large resistance value or a capacitor having a large capacitance value is used. Thus, a high-pass filter having a low cut-off frequency $f_c$ and suitable for incorporation in an IC can be provided.

Moreover, since the value of the cut-off frequency $f_c$ is determined according to the gate areas of the pMOS transistors 11 and 12, manufacturing variation can be limited to a small value, in comparison with the conventional art in which a high-pass filter is constituted by an ordinary CR circuit. Also, the high-pass filter can be stabilized in a temperature characteristic.

Figure 4:
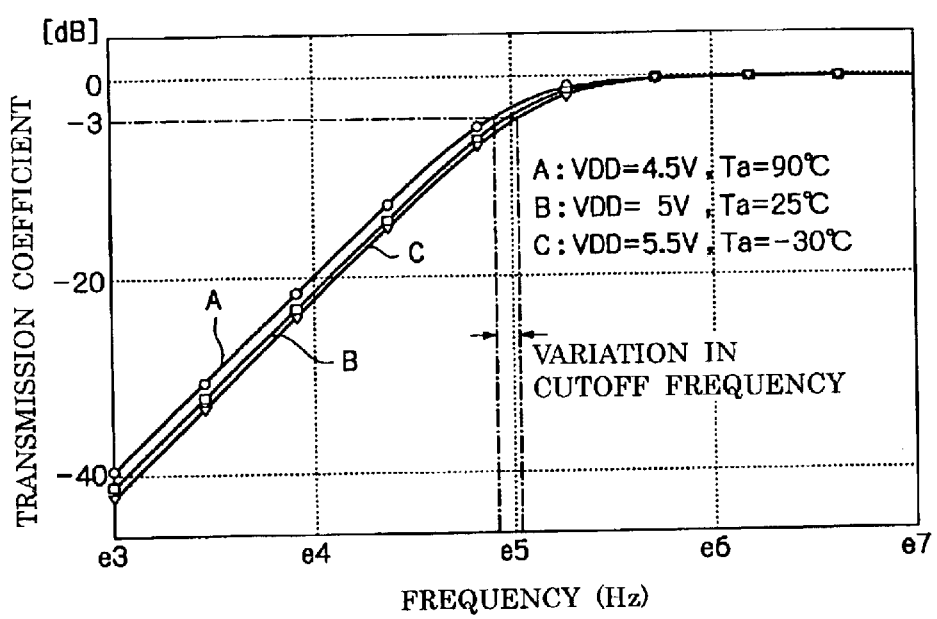
FIG. 4 is a diagram showing transfer frequency characteristics of the high-pass filter according to the embodiment.

FIG. 4 is a diagram showing transfer frequency characteristics of the high-pass filter of this embodiment. FIG. 4 shows the results of measurement with respect to the values of the power source VDD and the temperature Ta in three patterns A to C: (VDD, $T_a$)=(4.5 V, 90° C.), (5 V, 25° C.), (5.5 V, −30° C.) by way of example. As can be understood from this example, variation in cutoff frequency $f_c$ is small even if the values of the power source VDD and the temperature $T_a$ are largely changed. In this example, the variation is limited to about ±20%.

Figure 5:
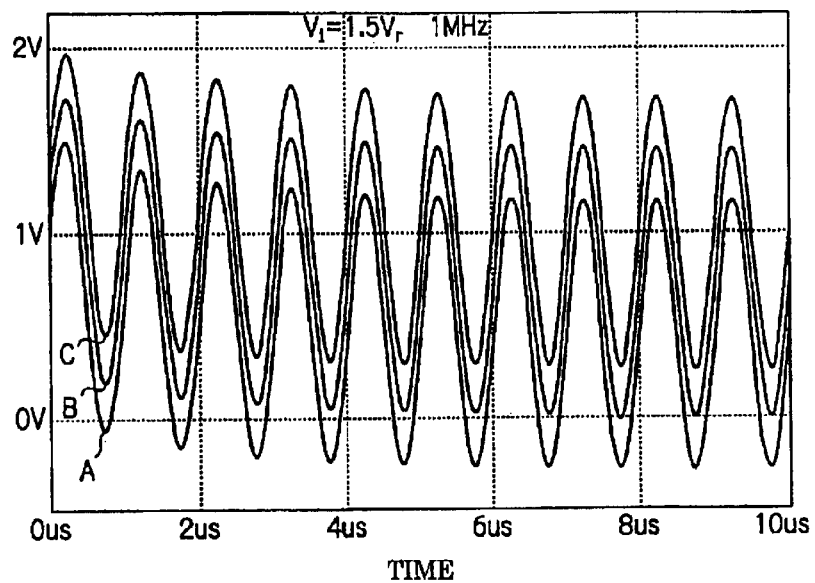
FIG. 5 is a diagram showing phase characteristics of the high-pass filter according to the embodiment.

FIG. 5 is a diagram showing phase characteristics of the high-pass filter of this embodiment. FIG. 5 also shows the results of measurement with respect to the values of the power source VDD and the temperature $T_a$ in three patterns A to C: (VDD, $T_a$)=(4.5 V, 90° C), (5 V, 25° C.), (5.5 V, −30° C.) by way of example. The phase characteristics are shown with respect to a case where the filter input voltage $V_i$ is 1.5 V and the frequency is 1 MHz. As can be understood from this example, variation in phase can be limited to a sufficiently small value even if the values of the power source VDD and the temperature $T_a$ vary largely.

Further, the high-pass filter of this embodiment has the advantage of enabling the filter output voltage $V_o$ to be directly used as a bias voltage for an operational amplifier connected in a stage following the output end OUT. That is, a DC voltage is applied to the output end OUT of the high-pass filter by the function of the nMOS transistor 13. Therefore the DC voltage can be directly used as a bias voltage for an operational amplifier in a case where the operational amplifier is connected in a stage following the high-pass filter.

FIG. 6 is a diagram showing the configuration of a secondary high-pass filter. As shown in FIG. 6, in a case where a high-pass filter is formed by a capacitor 101 and a resistor 102 conventionally used and an operational amplifier 105 is connected in a stage following the high-pass filter, there is a need to provide a bias circuit 104 for shifting the operating point of the operational amplifier 105 from the zero point in order to make the operational amplifier 105 operate as a linear amplifier. There is also a need to provide another capacitor 103 between the output stage of the high-pass filter and the operational amplifier 105. In this case, however, the filter characteristics are impaired due to the configuration in which additional capacitor 103 is provided between the high-pass filter and the operational amplifier 105.

In contrast, in the arrangement based on the high-pass filter of this embodiment, the nMOS transistor 13 also functions as a bias circuit, there is no need to separately provide a bias circuit, and there is also no need to separately provide an additional capacitor. That is, the filter output voltage $V_o$ output to the output end OUT can be used directly as a bias voltage for the operational amplifier. If a higher bias voltage is required, a plurality of the pMOS transistor 11 and a plurality of the nMOS transistor 13 may be provided in a vertically stacked form.

The above-described embodiment is only an example of implementation of the present invention and this example is not to be construed as limiting the technical scope of the present invention. That is, the present invention can be implemented in various modes without departing from the spirit or essential features of the invention.

INDUSTRIAL APPLICABILITY

The present invention is useful in providing a high-pass filter having a limited circuit area, even in the case of reducing the cutoff frequency, and which has small manufacturing variation and which is suitable for incorporation in an IC.

What is claimed is:

1. A filter circuit, comprising:
    a capacitor connected between a signal input end and an output node;
    a first constant current circuit of a MOS structure connected between said signal output end and a power source;
    a second constant current circuit of a MOS structure connected between said first constant current circuit and a ground;
    an nMOS transistor having a gate and drain thereof directly connected to the output node of said capacitor, and having a source thereof connected to the ground,
    wherein said first constant current circuit has first and second pMOS transistors connected in a current mirror structure to said power source, a drain of said first pMOS transistor being connected to said signal output end.

2. A filter circuit, comprising:
    a capacitor connected between a signal input end and a signal output end;
    a first constant current circuit of a MOS structure connected between said signal output end and a power source; and
    a second constant current circuit of a MOS structure connected between said first constant current circuit and the ground,
    wherein said first constant current circuit has first and second pMOS transistors connected in a current mirror structure to said power source, the drain of said first pMOS transistor being connected to said signal output end,
    wherein said second constant current circuit comprises:
        a first nMOS transistor having a drain connected to the drain of said second pMOS transistor, and having a gate connected to the drain of a second nMOS transistor;
        a first resistor connected between the source of said first nMOS transistor and the ground;
        said second nMOS transistor having a gate connected to the source of said first nMOS transistor and having a source and drain respectively connected to the ground and a second resistor; and
        said second resistor connected between the drain of said second nMOS transistor and the power source.

3. A filter circuit, comprising:
    a capacitor connected between a signal input end and a signal output end;
    a first constant current circuit of a MOS structure connected between a power source and the ground;
    a second constant current circuit operatively coupled to the first constant current circuit and the signal output end; and
    an nMOS transistor having a gate connected to the signal output end of said capacitor, and having a source and drain respectively connected to the ground and said signal output end,
    wherein said first and second constant current circuits are connected to an output side node of said capacitor.

4. A filter circuit, comprising:
    a capacitor connected between a signal input end and a signal output end;

a two-stage constant current circuit of a MOS structure connected between a power source and the ground; and an nMOS transistor having a gate connected to the signal output end of said capacitor, and having a source and drain respectively connected to the ground and said signal output end, wherein the output node of said capacitor and an intermediate node of said two-stage constant current circuit are connected to each other.

5. The filter circuit of claim 4, wherein a cut-off frequency of the filter circuit is determined, at least in part, by a value of current provided by the two-stage constant current circuit.

6. A filter circuit, comprising:

a capacitor connected between a signal input end and a signal output end;

a first constant current circuit of a MOS structure connected between said signal output end and a power source;

a second constant current circuit of a MOS structure connected between said first constant current circuit and a ground; and an nMOS transistor having its gate connected to the signal output end of said capacitor, and having a source and drain respectively connected to the ground and said signal output end.

7. The filter circuit of claim 6, wherein a cut-off frequency of the filter circuit is determined, at least in part, by relative gate widths of two MOS devices arranged in the first constant current circuit.

8. A high-pass filter, comprising:

a capacitor connected between a signal input and a high-pass filtered output terminal; and at least one constant current source comprising at least two MOS transistors coupled between a voltage source and the high-pass filtered output terminal, wherein a cut-off frequency of the high-pass filter is determined, at least in part, by a value of current provided by the at least one constant current source.

9. The high-pass filter of claim 8, further comprising an nMOS transistor having a gate and drain thereof directly connected to the high-pass filtered output terminal, and having a source thereof connected to the ground.

10. The high-pass filter of claim 8, wherein the cut-off frequency of the high-pass filter is determined, at least in part, by a ratio of respective gate widths of two of the at least two MOS transistors.

11. The high-pass filter of claim 10, further comprising an nMOS transistor having a gate and drain thereof directly connected to the high-pass filtered output terminal, and having a source thereof connected to the ground.

12. The high-pass filter of claim 10, wherein respective gate lengths of said two of the at least two MOS transistors are equal.

13. The high-pass filter of claim 8, wherein the at least two MOS transistors comprise two pMOS transistors.

14. A method for performing on-chip high-pass filtering of an input signal, the method comprising:

capacitively coupling an input signal to an output node;

connecting at least one constant current source having at least two MOS transistors therein to the output node; and determining a high-pass cut-off frequency by setting a value of current in one of the at least two MOS transistors, wherein said setting a value of current in one of the at least two MOS transistors comprises establishing a ratio of gate widths of each of the at least two MOS transistors.

* * * * *